(12) United States Patent
Marty et al.

(10) Patent No.: US 7,038,289 B2
(45) Date of Patent: *May 2, 2006

(54) DEEP INSULATING TRENCH

(75) Inventors: Michel Marty, St Paul de Varces (FR); Arnoud Fortuin, Crolles (FR); Vincent Arnal, Grenoble (FR)

(73) Assignees: STMicroelectronics SA, Montrouge (FR); Koninklijke Philips Electronics, Eindhoven (NL)

( * ) Notice: Subject to any disclaimer, the term of this patent is extended or adjusted under 35 U.S.C. 154(b) by 63 days.

This patent is subject to a terminal disclaimer.

(21) Appl. No.: 10/479,639

(22) PCT Filed: Jun. 13, 2002

(86) PCT No.: PCT/FR02/02029

§ 371 (c)(1),
(2), (4) Date: Dec. 4, 2003

(87) PCT Pub. No.: WO02/103772

PCT Pub. Date: Dec. 27, 2002

(65) Prior Publication Data

US 2004/0147093 A1     Jul. 29, 2004

(30) Foreign Application Priority Data

Jun. 5, 2002 (FR) .................. 01 07774

(51) Int. Cl.
*H01L 29/00* (2006.01)

(52) U.S. Cl. .............. 257/501; 257/510; 257/516; 257/522; 438/424; 438/439; 438/672

(58) Field of Classification Search ............. 257/501, 257/506, 510–513, 522–524; 438/637–639, 438/672–674
See application file for complete search history.

(56) References Cited

U.S. PATENT DOCUMENTS 6,828,646 B1 * 12/2004 Marty et al. ............ 257/501

* cited by examiner

*Primary Examiner*—Dung A. Le
(74) *Attorney, Agent, or Firm*—Lisa K. Jorgenson; Allen, Dyer, Doppelt, Milbrath & Gilchrist, P.A.

(57) ABSTRACT

Deep isolation trenches having sides and a bottom are formed in a semiconductor substrate. The sides and the bottom are coated with an electrically insulating material that delimits an empty cavity, and forms a plug to close the cavity. The sides of the trench are configured with a neck that determines the depth of the plug, and a first portion that tapers outwards from the neck as the distance from the bottom increases. Deep isolation trenches may be applied, in particular, to bipole and BiCMOS circuits.

20 Claims, 9 Drawing Sheets

DEEP INSULATING TRENCH

This application is a 371 of PCT/FR02/02029 Jun. 13, 2002.

FIELD OF THE INVENTION

The present invention relates to the manufacture of integrated circuits, and more particularly, to circuits using bipole or BiCMOS technologies.

BACKGROUND OF THE INVENTION

Deep isolating trenches formed in a substrate are intended to isolate the different elements of the circuit from each other, and to minimize parasitic components that exist between the structures. These deep isolating trenches are known as DTI (Deep Trench Isolation). Deep means that the depth of the trenches is greater than their width, and is much greater than the depth of the buried layers in the substrate. These deep trenches are used to separate the N+ and P+ buried layers, and thus reduce the perimeter component of the collector/substrate capacitance. These capacitances contribute to the calculation of circuit noise and to the oscillation frequency of bipole transistors.

Deep isolating trenches surround bipole transistors and are full of electrically insulating material. Silicon is by far the most frequently used material in the microelectronics industry, and the material used in silicon circuits is usually silicon oxide.

There are various methods of forming these deep isolating trenches. They may be formed at the end of a process after the transistors have been made, or at the beginning of the process before the transistors are made.

When the trenches are formed at the end of the process, they have a large perimeter due to the fact that there is obviously no need to cut the elements of the transistor. The surface component of the collector/substrate capacitance is the same with or without a deep trench. The gain on the perimeter component is due to the fact that the value of the capacitance of the trench per unit length is less than the junction capacitance when there is no trench. The total gain on the collector/substrate capacitance is limited with this type of trench.

If trenches are formed at the beginning of the process, their perimeter can be limited since, for example, the contact point of the base can be stacked above the trench. The collector/substrate perimeter capacitance is lower than in the previous configuration. But once the trenches have been filled with electrically insulating material, a number of thermal cycles will be applied to the substrate to produce transistors or other components. These cycles will generate high mechanical stresses between the substrate and the filling material. These stresses are generated by the differences in the coefficients of thermal expansion between the silicon and the trench filling material. The difference in coefficients of thermal expansion between silicon and the silicon dioxide usually used to fill these trenches is on the order of a factor of 10.

Beyond a threshold stress, dislocations can be generated in the substrate material. When the dislocations intersect the junctions, junction leakage currents are very high and the circuit is unusable. This disadvantage is very limited if the trenches are formed at the end of the process, since in this case, the circuit is no longer subjected to high temperature cycles after the trenches have been filled.

A composite filling with two different materials to limit the development of these dislocations has been proposed if the trenches are formed at the beginning of the process. For example, the sides and bottom can be covered with a layer of oxide and the entire interior can be filled with polycrystalline silicon. But the value of the capacitance per unit length of a composite filling is greater than the value of a filling with oxide. This is because the relative permittivity of polycrystalline silicon is three or four times greater than the relative permittivity of the silicon dioxide.

SUMMARY OF THE INVENTION

In view of the foregoing background, an object of the present invention is to provide a different system in which the isolating capacity of a deep isolating trench is minimized, and without introducing any risk of dislocation of the substrate.

This and other objects, advantages and features according to the present invention is provided by a deep isolating trench with sides and a bottom in a semiconductor substrate. These sides and this bottom are coated with an electrically insulating material. The electrically insulating material delimits an empty cavity and forms a plug to close the cavity. The sides of the trench are configured with a neck that determines the depth of the plug, and a first portion that tapers outwards from the neck as the distance from the bottom increases.

By forming an empty space in the cavity, in other words, a space without any solid material but with air and/or residual gasses, the parasitic capacitance of the trench is reduced because the relative permittivity of the air and/or residual gasses is on the order of 1. The relative permittivity of the electrically insulating material, usually silicon oxide, is more than 4.

The risks of dislocation in the substrate are low, due to the presence of the empty cavity and the small volume of the electrically insulating material that only coats the sides and the bottom of the deep trench. The layer of electrically insulating material that delimits the empty cavity has a relative elasticity, which a solid block does not have.

The depth of the first portion in the semiconductor substrate will be between about 0.2 and 1 micrometer. The first portion tapering outwards may have a slope of between about 50 and 85 degrees. The maximum width of the first portion may be equal to about twice the width of the neck. The sides between the neck and the bottom may comprise a second portion in which they are approximately parallel.

If there is a requirement to maximize the volume of the empty cavity, it is preferable that the sides should include a second portion between the neck and the bottom. This second portion tapers outwards from the neck as the distance from the bottom reduces. The sides then have the profile of a bottle. In another embodiment, the sides may comprise a second portion that is convex between the neck and the bottom. These sides then have the profile of a carboy, i.e., like a container for liquids. The bottom may be convex or approximately flat.

The deep isolating trench is usually designed to cooperate with a shallow isolating trench formed in the semiconductor material, and which is full of electrically insulating material. The deep isolating trench comprises a bottom and sides. The widest part of the first portion then opens up in the bottom of the shallow isolating trench.

The invention also relates to an integrated circuit that comprises at least one deep isolating trench as defined above, and an electronic or electrical device that comprises at least one such integrated circuit.

This invention also relates to a process for forming a deep isolating trench in a semiconductor substrate. This trench having a bottom, sides and an opening. The process comprises the following steps. A layer of electrically insulating material is deposited on the substrate to make a hard mask. The hard mask is etched to form an opening corresponding to the opening in the trench.

The process further comprises etching the sides and bottom of the trench through the hard mask in the semiconductor material, providing a neck between the bottom and the opening, and making a first portion of the sides that is smaller from the opening towards the neck, and then a second portion of the sides between the neck and the bottom. The hard mask is eliminated, and there is a nonconformal deposit of an electrically insulating material that coats the sides and the bottom. This delimits an empty cavity and forms a plug to close the cavity.

The trench may be etched by plasma using a gaseous mix with first proportions to make the first portion of the sides, and second proportions to make the second portion of the sides. The gaseous mix may contain hydrobromic acid HBr, oxygen $O_2$ and sulfur hexafluoride $SF_6$. The proportion of sulfur hexafluoride $SF_6$ in the gaseous mix will also be greater for making the second portion of the sides than for making the first portion of the sides.

The process may comprise a thermal annealing step after the etching step to restore the surface condition of the sides and the bottom. After the etching step, the process may comprise an ionic implantation step in the trench. This type of ionic implantation is opposite to the type of the semiconductor substrate.

The electrically insulating material deposited to coat the sides and the bottom may be doped. The deposition step is followed by a rapid heat annealing step causing the electrically insulating material to spread. The process according to the invention may comprise a step for surface removal of the electrically insulating material deposited to coat the bottom and sides, and if necessary, a surface leveling step.

When the deep isolating trench cooperates with a shallow isolating trench with sides and a bottom, and with the opening in the deep isolating trench being in the bottom of the shallow isolating trench, the process may comprise a step in which the shallow isolating trench is etched before the step to deposit the electrically insulating material making the hard mask. In this embodiment, the step in which the nonconformal deposition of the electrically isolating material contributes to filling the shallow isolating trench.

BRIEF DESCRIPTION OF THE DRAWINGS

Other characteristics and advantages of the invention will become clear after reading the following description illustrated by the attached figures.

DETAILED DESCRIPTION OF THE PREFERRED EMBODIMENTS

Figure 1A:
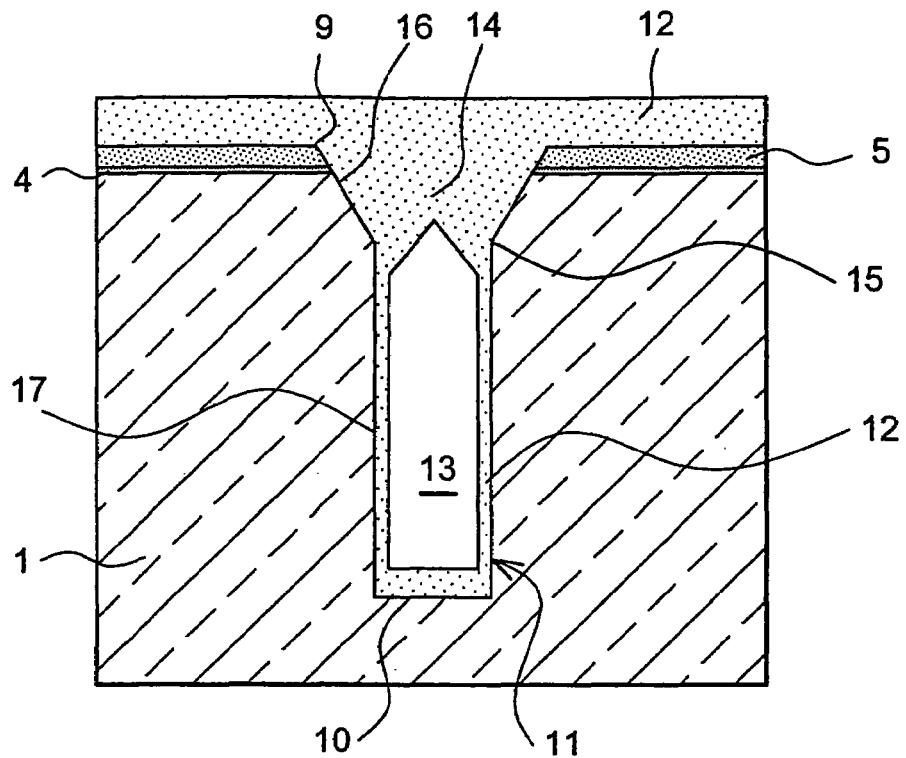
FIGS. 1A, 1B and 1C are cross-sectional views of several examples of deep isolating trenches in accordance with the present invention.
Figure 1B:
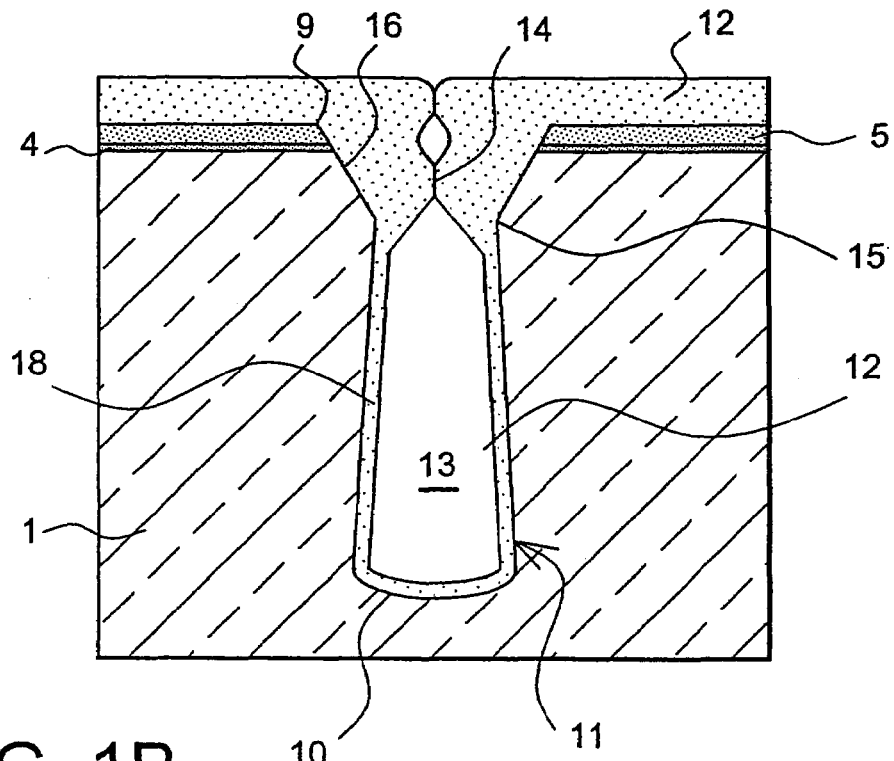
Figure 1C:
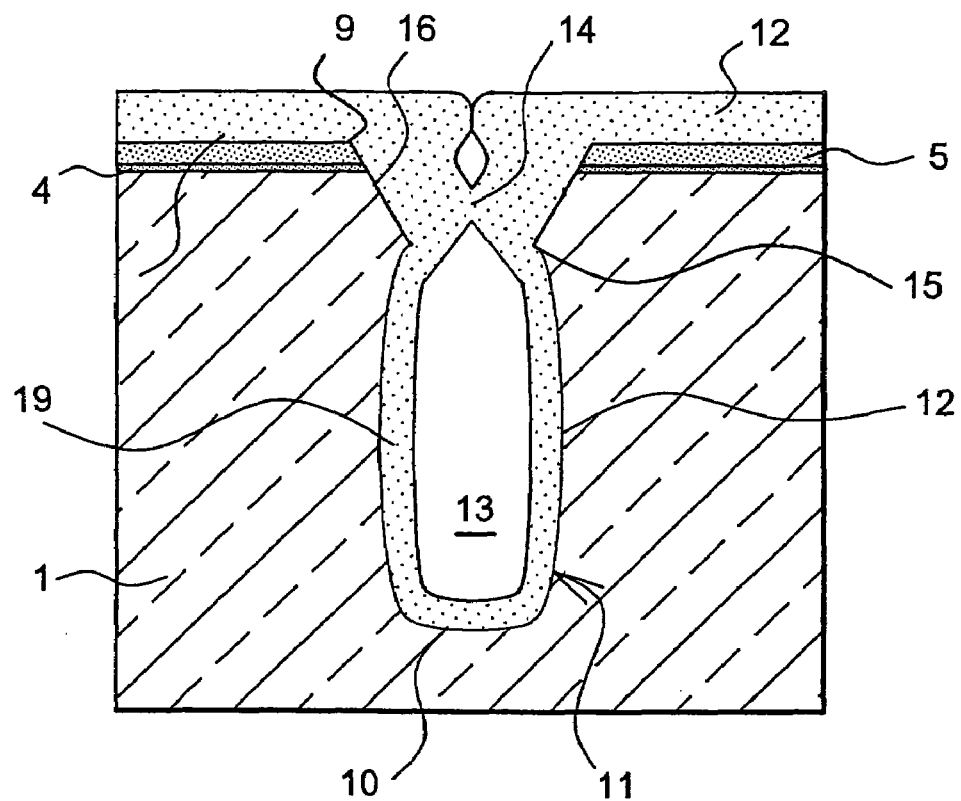

FIGS. 1A to 1C illustrate examples of deep trenches according to the invention. An integrated circuit with a substrate 1 made of a semiconductor material of a type in which a deep isolating trench has been formed is shown diagrammatically.

The deep isolating trench comprises a bottom 10, sides 11 and an opening 9. According to the invention, the bottom 10 and the sides 11 formed in the semiconductor material are covered by an electrically insulating material 12 that delimits an empty cavity 13 closed at the bottom by a plug 14. The sides 11 comprise a neck 15 that defines the position of the plug 14, and a first portion 16 that tapers outwards from the neck 15 towards the opening 9 as the distance from the bottom 10 increases. The slope of this first portion 16 is said to be positive.

The greatest width of the first portion 16 may be equal to about twice the width of the neck 15. An empty cavity 13 means a cavity that does not contain any solid material. The empty part contains air and/or residual gasses that are formed when the trench is filled with the electrically insulating material 12. The sides may be approximately parallel between the neck 16 and the bottom 10 over a second portion 17, as shown in FIG. 1A.

Generally, for a given trench width, it is preferred to increase the volume of the empty cavity 13 to reduce the isolating capacity by minimizing the thickness of the electrically insulating material 12 that delimits the empty cavity 13. The relative permittivity of air or residual gasses in the cavity 13 is much less than the relative permittivity of the electrically insulating material 12. In this case, it is preferable that the sides 11 should comprise a second portion 18 tapered outwards from the neck 15 towards the bottom 10. The sides 11 have the profile of a bottle. The bottom 10 may be rounded. This variation is illustrated in FIG. 1B.

The volume of the empty cavity 13 can be further increased by configuring the sides 11 to comprise a second portion 19 that is convex and tapered outwards between the neck 15 and the bottom 10. The sides have the concave profile of a container for liquids. This variation is illustrated in FIG. 1C. The bottom 10 is shown rounded, but it could also be substantially flat. A rounded bottom is preferred to avoid stresses due to shape errors that can occur with a flat bottom.

The slopes of the second portions 18 or 19 are said to be negative. The advantage of sides with a negative slope is that the thickness of the electrically insulating material 12 is minimized. A process to form a deep isolating trench in a semiconductor substrate 1 will now be described with reference to FIGS. 2A to 2H.

This trench will be made at the beginning of the manufacturing process before the transistors have been made. However, since the deep isolating trench is required to isolate a transistor (not shown) of the substrate, buried doped active areas 2, 3 of opposite types N+ and P+ respectively have already been formed in the semiconductor substrate 1, which are made of silicon.

Figure 2A:
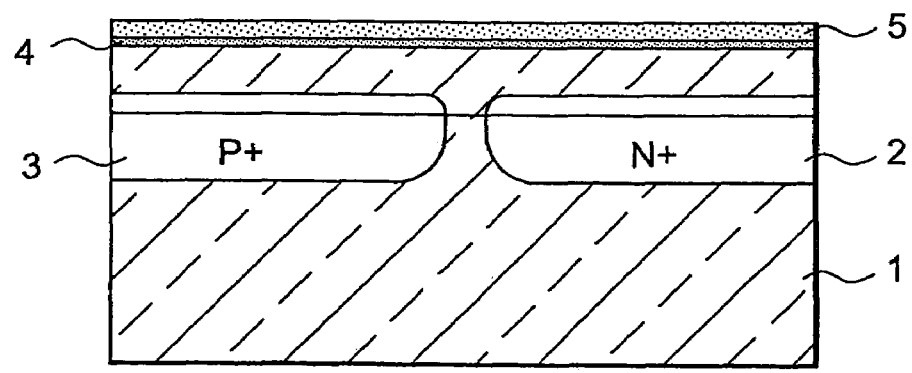
FIGS. 2A to 2H are cross-sectional views illustrating the steps in a process to form a deep isolating trench in accordance with the present invention.

It is also assumed that the substrate 1 was epitaxied on the surface after formation of the buried areas. The semiconductor substrate 1 is preferably covered with an insulation that will be used later, particularly when making the transistors. The first layer is a thin layer of oxide 4 (silicon oxide in the example) that covers the semiconductor substrate 1, followed by a layer of sacrificial nitride 5 (silicon nitride in the example) that covers the oxide. The thickness of the nitride layer may, for example, be between 5 and 20 nanometers (FIG. 2A).

The first step is to deposit an electrically insulating material 6 that will act as a hard mask for etching the deep isolating trench. In the example, the electrically insulating material may, for example, be silicon oxide deposited by chemical vapor phase reactions, and more precisely, by decomposition of tetraethylorthosilicate, known as TEOS. For example, the oxide thickness may be between 200 and 400 nanometers. A photosensitive resin layer alone will not be suitable due to the depth to be etched.

Figure 2B:
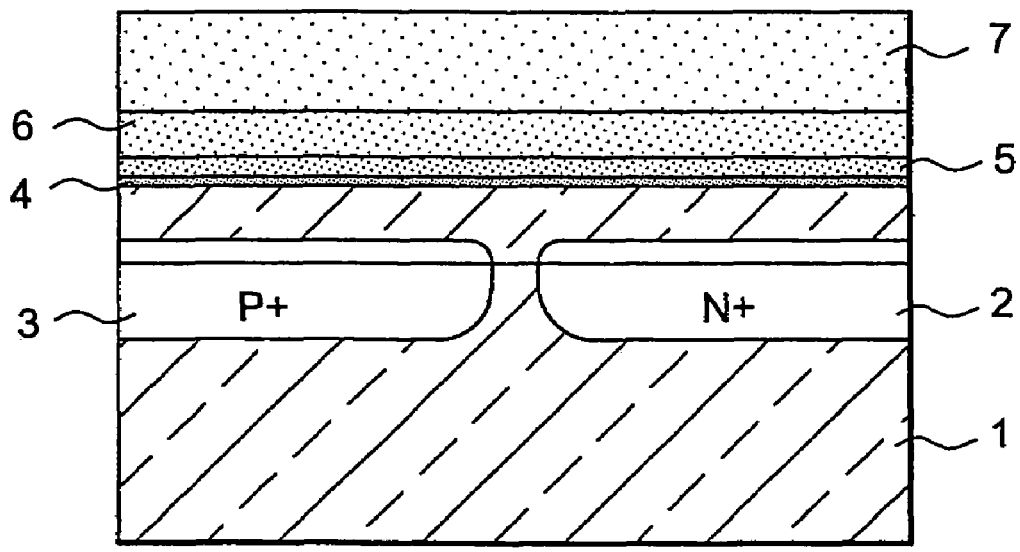

The next step is to deposit a photosensitive resin 7 on the previous oxide layer 6 (FIG. 2B). The next step is to determine the pattern of the deep trench by transferring the appropriate pattern that corresponds to the opening 9 of the trench onto the resin 7, and developing the resin.

Figure 2C:
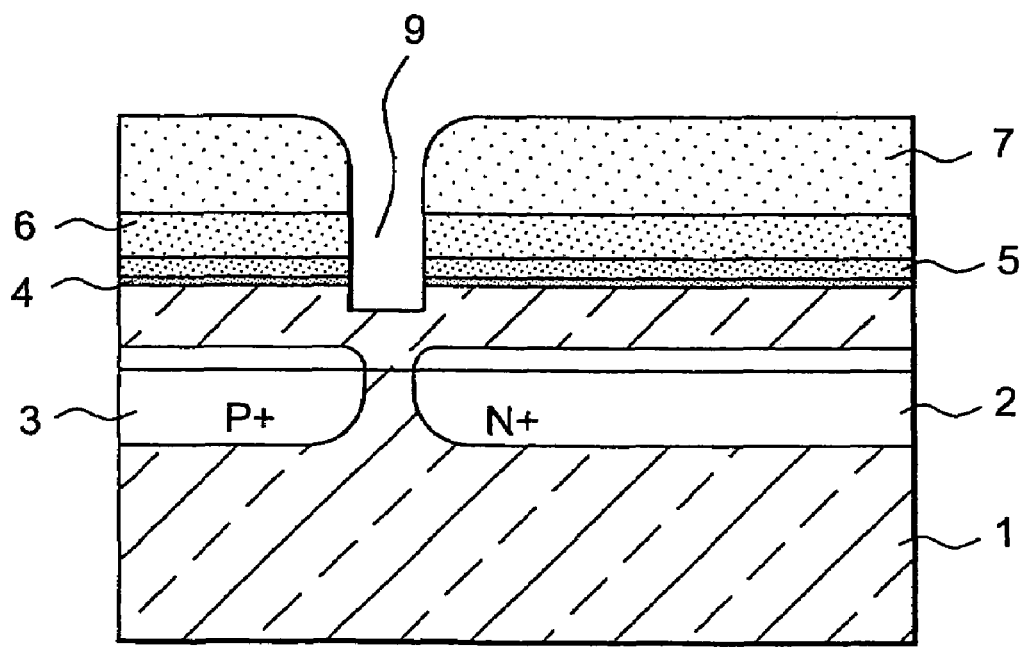

A first etching step takes place in which an opening is formed in the hard mask 6. This opening corresponds to the opening 9 of the trench. When the hard mask 6 is opened, the silicon in the substrate 1 is exposed so that the nitride 5 and the fine oxide 4 can be etched. This etching may be a plasma etching using a gas that attacks the nitride and the oxide, and is selective towards silicon (FIG. 2C).

Figure 2D:
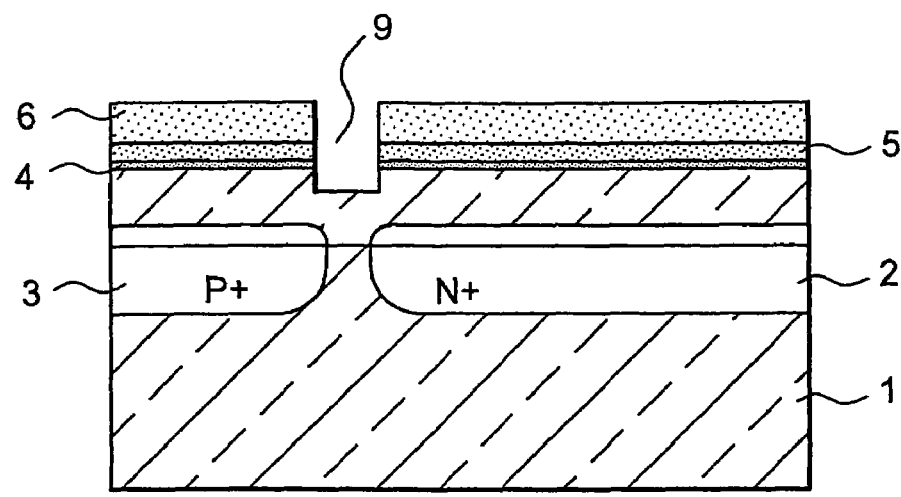

The next step is to remove a thickness of the resin 7 (FIG. 2D). The next step is then to etch the sides 11 and the bottom 10 of the deep trench. Etching is a dry plasma assisted etching, for example, an RIE reactive type etching. This etching will be done in two steps to obtain the required profile with the neck 15 and the two portions 16 and 17 or 18, or 19 on each side of the neck 15. The first step is to etch the first portion 16 that tapers outwards from the neck 15 as the distance from the bottom 10 increases, or conversely, that gets narrower from the opening 9 towards the neck 15 since this is the direction in which etching is done.

The depth of this first portion 16 may, for example, be between about 0.2 and 1 micrometer starting from the surface of the semiconductor substrate. The inclination of the sides of the first portion 16 tapering outwards may be between about 50 and 85 degrees from the surface of the substrate 1 which is covered by the mask 6. Obviously, the slope is very important so that the empty cavity will remain when the trench is filled. In the prior art, the objective was quite different, which was to completely fill the isolating trench without creating any empty spaces and keeping the sides parallel over the entire depth of the trench.

The first portion 16 tapering outwards is etched with a gaseous mix based on hydrobromic acid HBr and oxygen $O_2$ and sulfur hexafluoride $SF_6$. This gaseous mix anisotropically attacks the material in the substrate, and the required slope can be achieved. Due to the presence of oxygen, silicon oxide is formed and is deposited on the sides 11 and the bottom 10. But hydrobromic acid HBr does not etch the oxide thus created, and this oxide can only be etched by sulfur hexafluoride $SF_6$. The proportions of the three gasses are adjusted to obtain the required profile for the first portion 16 tapering outwards. The oxide deposited on the bottom is etched much more quickly than the oxide deposited on the sides.

Figure 2E:
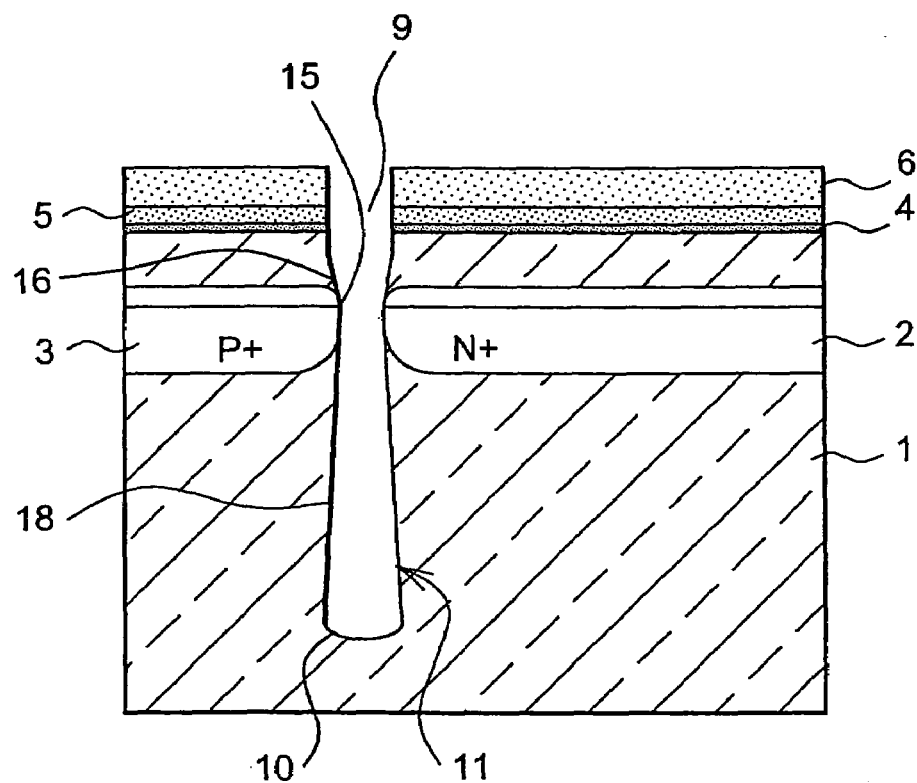

The proportions of gasses in the mix are changed at the neck 15 in order to etch the second portion 17, 18 or 19 of the sides between the bottom 10 and the neck 15, and in which the slope is not the same as the slope of the first portion 16. The gaseous mix contains a larger quantity of sulfur hexafluoride $SF_6$ so that the etching will be continued with the required slope. The second portion of the sides will preferably be more than about 3 micrometers deep. This step is illustrated in FIG. 2E.

Gas proportions in the gaseous mix, the pressure in the chamber used and the high frequency power to create the plasma are adjusted to determine the anisotropy ratio and the etching speed. These two factors define the slope and depth of the different portions. This gives control over the slope and depth during etching. Conventionally, ionic implantation of the type opposite to the type of implantation in the substrate 1 is done on the deep trench to deviate lines of current that originate in the substrate to prevent current leaks.

Figure 2F:
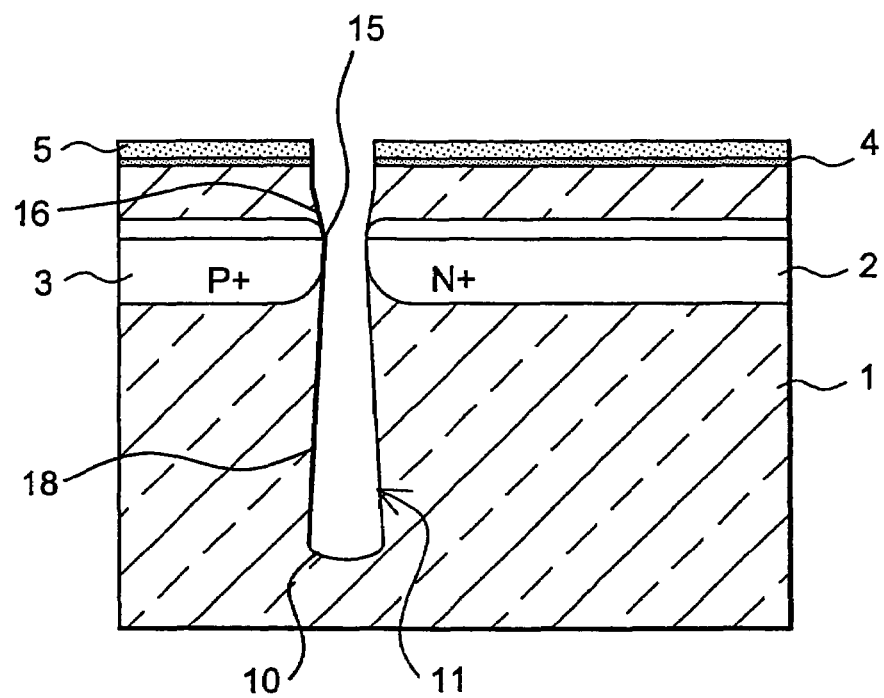

The next step is to eliminate the hard mask 6 and etching residues. These residues include the oxide that formed during etching of the trench (FIG. 2F). The oxide that formed in the deep trench during etching is not shown since it is very thin. For example, this elimination may be done chemically in a bath of dilute hydrofluoric acid HF. The next step is to apply a Rapid Thermal Oxidation (RTO) type annealing to the deep trench to restore the surface condition of its sides and bottom damaged by the etching. This limits circulation of leakage currents that could originate on these damaged surfaces.

Figure 2G:
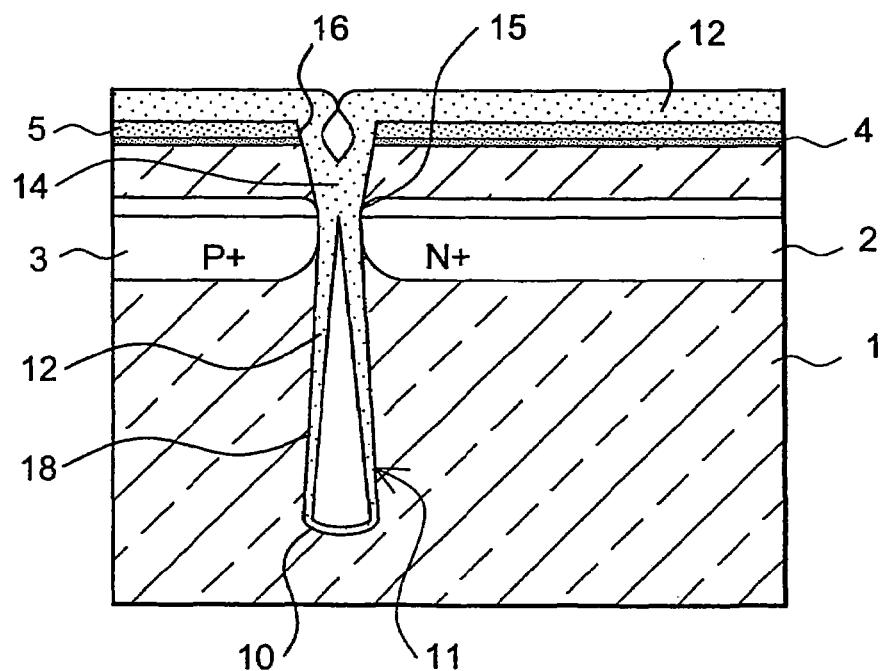

The next step is to fill in the trench with an electrically insulating material by creating the empty cavity 13 and the closing plug 14 (FIG. 2G). This deposition of an electrically insulating material 12, which is silicon oxide in the example, may be done by chemical vapor phase reactions CVD, plasma assisted chemical vapor phase reactions PECVD with at least one precursor making the deposit nonconformal, or by high density plasma.

A nonconformal deposit is made more quickly on horizontal surfaces than on vertical surfaces. Therefore, this deposit takes place more quickly on the first portion 16 tapering outwards and on the surface of the substrate 1 than on the second portion 17, 18, 19 and on the bottom 10. The plug 14 is formed in the narrowest part of the first portion 16 tapering outwards close to the neck 15. Therefore, it forms a deep closure for the empty cavity 13 located between the bottom 10 and the neck 15.

TEOS or silane $SiH_4$ may be used as the precursor. The electrically insulating material 12 may be doped, for example, silicon oxide may be doped using boron or phosphorus. A thermal annealing step then takes place to make the electrically insulating material spread to adjust the position of the closing plug 14.

Figure 2H:
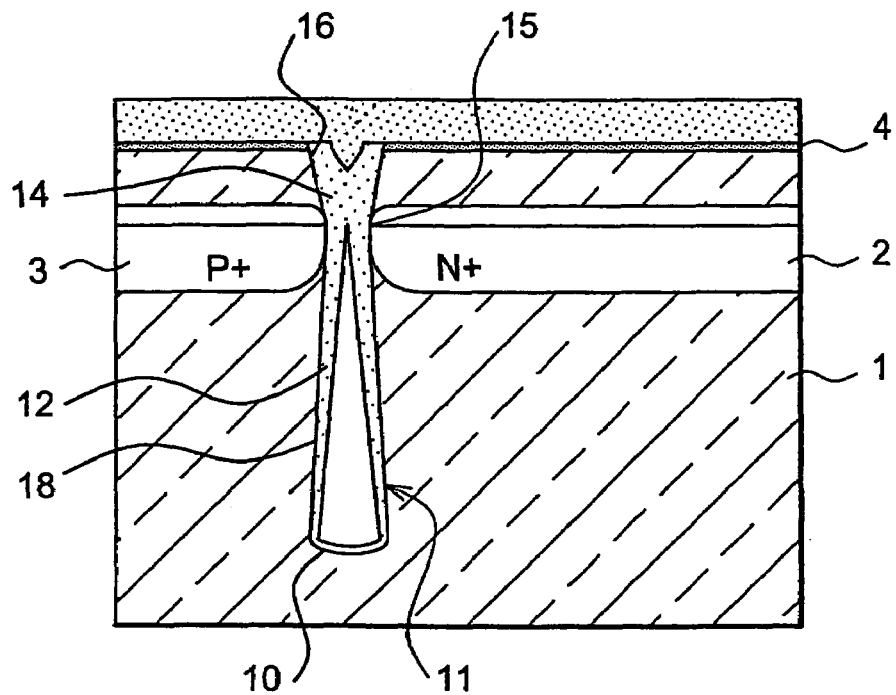

This type of deep isolating trench is particularly robust, and the buried layers 2, 4 that stop in contact with its sides 11 are blocked during subsequent heat treatments. It is then no longer necessary to make a P+ implantation at the bottom of the deep trench as it was in prior art in which the trench passed through a buried area. For example, chemical-mechanical polishing may be used to remove the oxide 12 deposited in this way and located on the surface, and if necessary, to perform a surface leveling step (FIG. 2H).

In bipole and BiCMOS circuits, the deep isolating trenches cooperate with shallow isolating trenches (STI for Shallow Trench Isolation). A shallow isolating trench is a trench with a depth less than the depth of the compartments in which the transistors are located.

The shallow isolating trench 30 comprises sides 31 and a bottom 32, and it is full of electrically insulating material 33.

Figure 3:
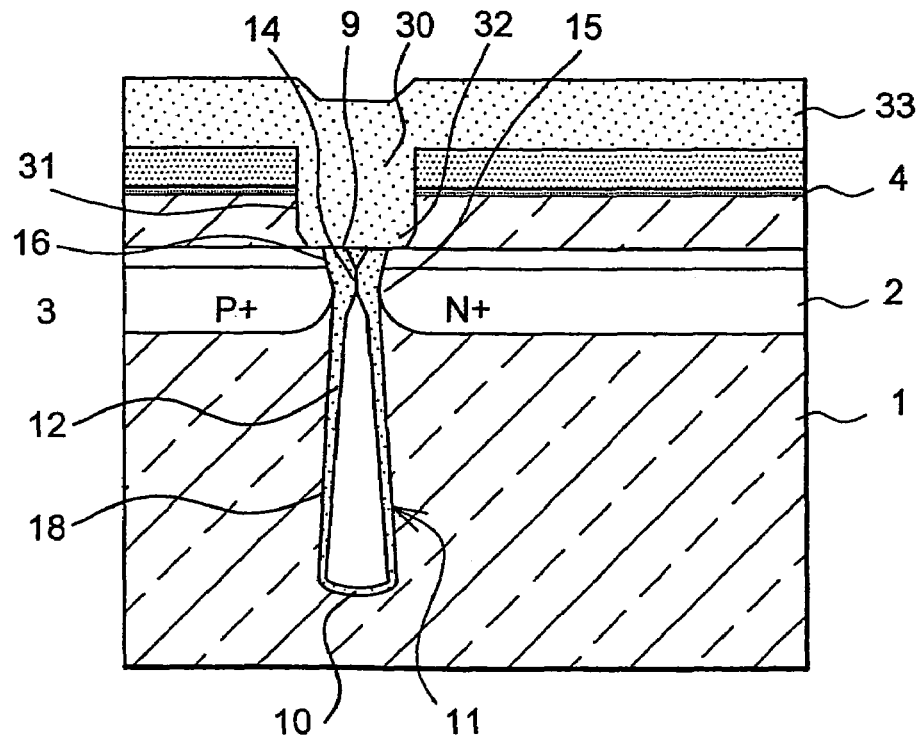
FIG. 3 is a cross-sectional view through a deep isolating trench in accordance with the present invention that cooperates with a shallow isolating trench.

Its bottom 32 opens up into the first portion 16 tapering outwards in the deep isolating trench reference 20. This cooperation is shown in FIG. 3. The bottom 32 of the shallow isolating trench 30 is wider than the opening 9 of the deep isolating trench. In other words, it is wider than the widest part of the first portion 16 tapering outwards.

The shallow isolating trench can be formed after the deep isolating trench has been formed. But it would also be possible to begin forming the shallow isolating trench before starting to form the deep isolating trench. In this case there are some steps that will be common for forming the two isolating trenches.

Figure 4A:
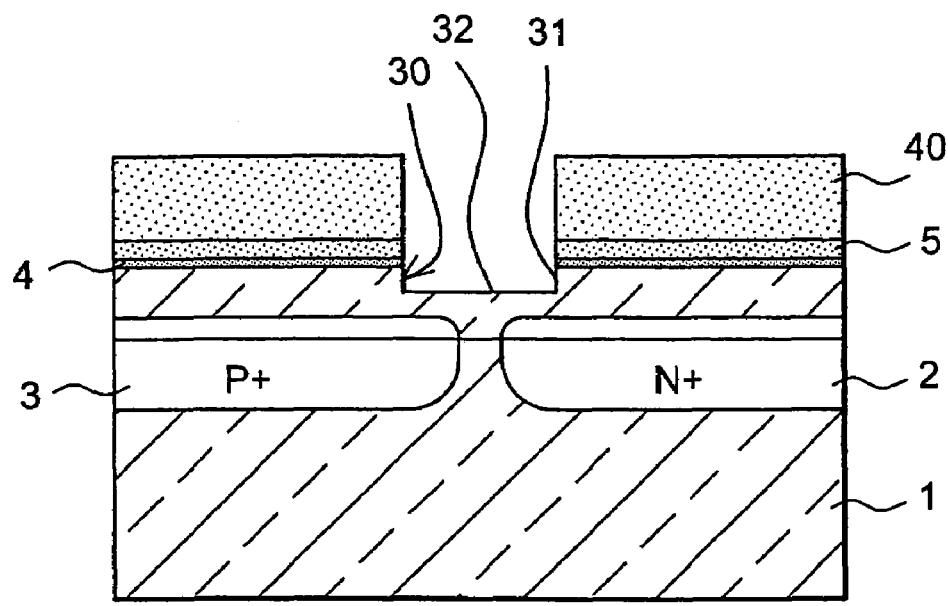
FIGS. 4A to 4E are cross-sectional views illustrating the steps in a process to form a deep isolating trench in accordance with the present invention, and this deep isolating trench cooperates with a shallow isolating trench formed at the same time.

A process for making deep isolating trenches that includes making the shallow isolating trenches will now be described. Starting from the substrate 1, which is of the same nature as the substrate shown in FIG. 2A including the oxide layer 4 and the sacrificial nitride layer 5. The first step is to etch the shallow isolating trench 30. A lithography step is performed with a resin deposit 40 on the nitride layer 5, followed by the transfer of the appropriate pattern corresponding to the opening 9 of the trench on the resin, and development of the resin 40. The shallow trench is then etched by plasma. This time, etching is anisotropic (FIG. 4A).

Figure 4B:
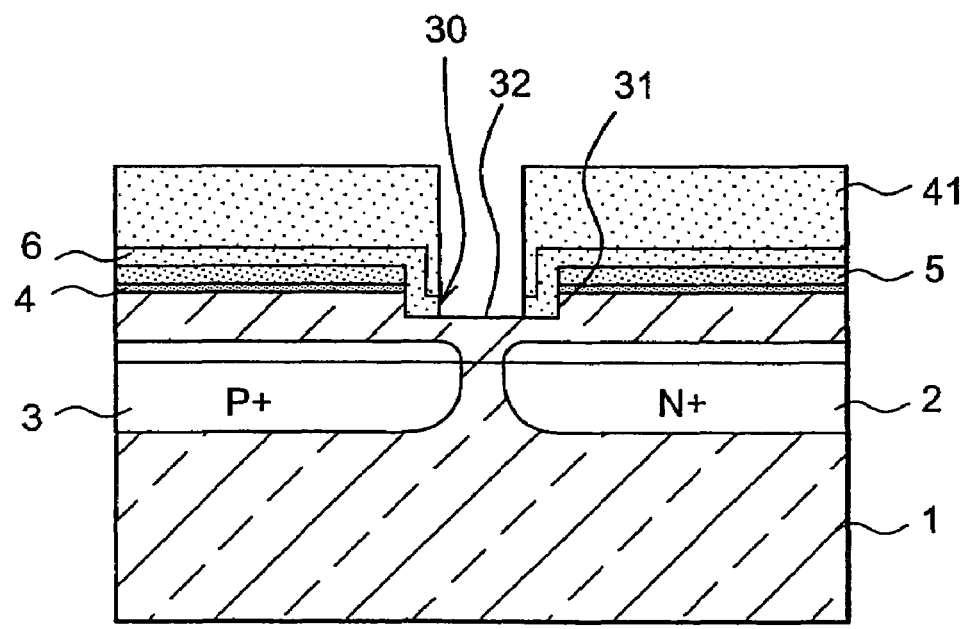
Figure 4C:
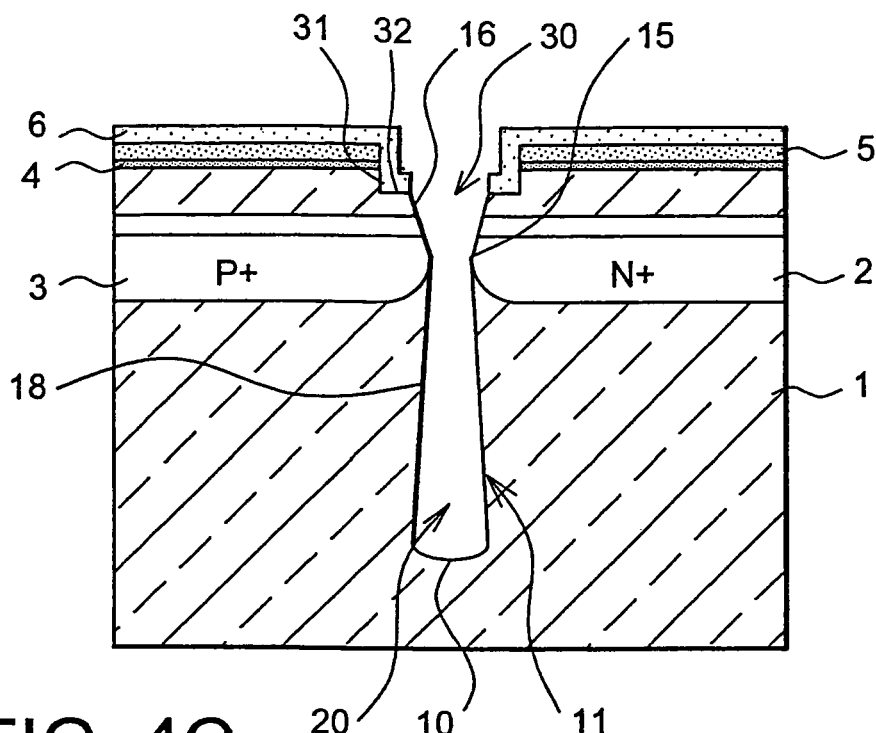

The next step is to remove a thickness of the resin 40. The electrically insulating material 6 that will act as a hard mask for etching the shallow isolating trench 30 is then deposited. This material will cover the sides 31 and the bottom 32 of the shallow isolating trench 30. This step was described above with reference to FIG. 2B. The steps described in FIG. 2B and the subsequent figures are then performed, namely the lithography step with the resin 41, leading to etching of the hard mask 6 (FIG. 4B), and removal of the resin 41. It is then possible to start etching the deep isolating trench as described above. This step is illustrated in FIG. 4C, and starts from the bottom 32 of the shallow isolating trench 30.

Figure 4D:
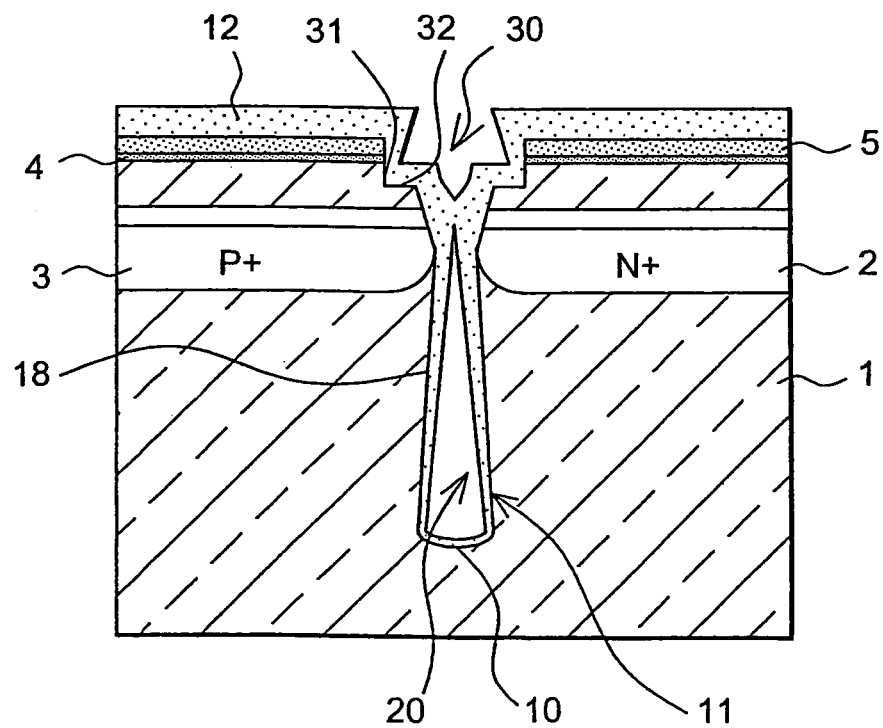

The ionic implantation in the deep isolating trench is then made. The next step is a step to eliminate the hard mask 6 and the oxide that formed in the deep trench. An RTO type annealing can be applied to the sides and bottoms of the two isolating trenches to restore their surface condition. The next step is to fill in the trenches by creating the empty space in the deep isolating trench 20 and filling the shallow isolating trench 30 entirely. As before, this step can be done using a nonconformal deposit of the electrically insulating material 12 that is used to form the plug 14 in the substrate 1, and also to fill in the shallow isolating trench (FIG. 4D).

Figure 4E:
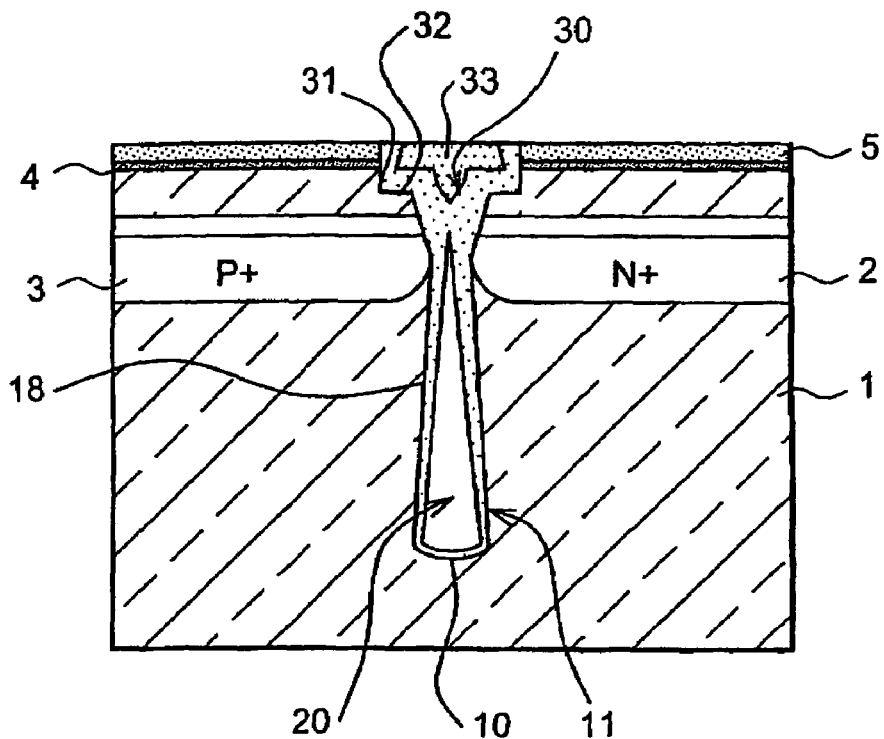

The shallow isolating trench 30 is not necessarily completely filled at the end of this step. Therefore, the final step is to fill it by making a deposit 33 of a conformal electrically insulating material, for example, by CVD. In the example, the last step could be a mechanical-chemical polishing which stops in the nitride 5 to achieve a plane surface (FIG. 4E).

Figure 5:
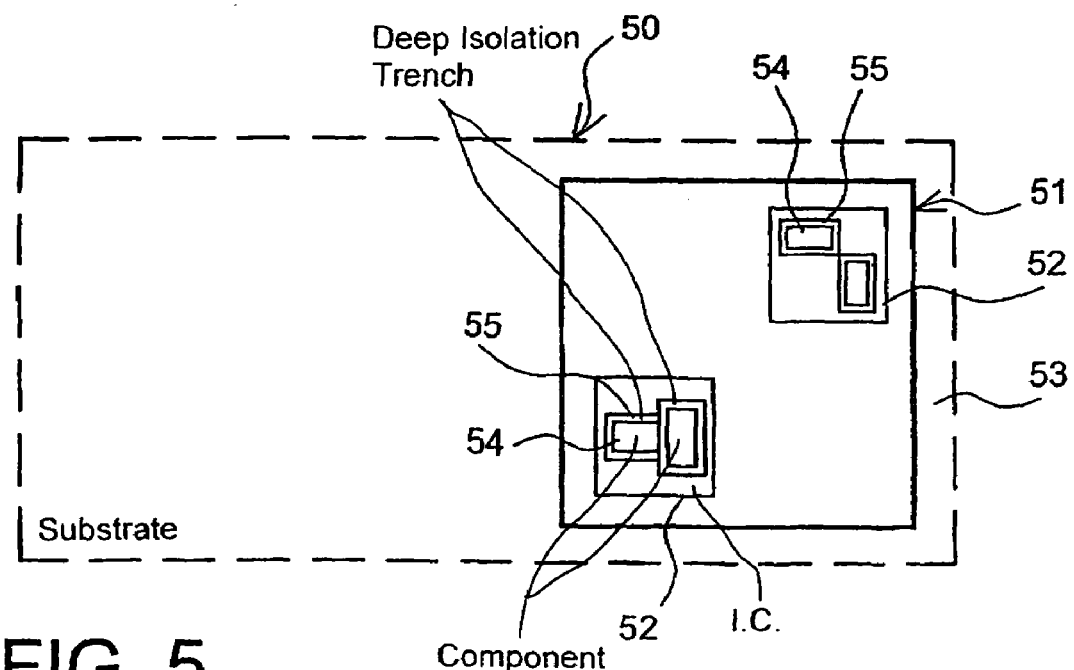
FIG. 5 diagrammatically illustrates an electronic or electrical device in accordance with the present invention.

This invention is not limited to the materials or the deposit techniques or the etching techniques mentioned in the described examples. This invention also relates to an electronic or electrical apparatus 50 like that shown diagrammatically in FIG. 5, provided with a semiconductor device 51 including at least one integrated circuit 52 on a substrate 53. This integrated circuit 52 is provided with components or sets of components 54 surrounded by at least one deep isolating trench 55 as described herein. For example, the electronic or electrical apparatus could be a mobile telephone or a line amplifier used in bases for cordless telephony communications.

What is claimed is:

1. An integrated circuit comprising:
   a semiconductor substrate having at least one deep isolation trench therein defined by side walls and a bottom wall, the side walls being configured with a neck and including first portions that taper outwards from the neck as a distance from the bottom wall increases; and
   insulation material on the side walls and on the bottom wall of the at least one deep isolation trench for delimiting a cavity therein, and for forming a plug that closes the cavity, with the neck determining a depth of the plug.

2. An integrated circuit according to claim 1, wherein at a depth of the neck is within a range of about 0.2 to 1 micrometer from a surface of said semiconductor substrate.

3. An integrated circuit according to claim 1, wherein a slope of the first portions is within a range of about 50 to 85 degrees.

4. An integrated circuit according to claim 1, wherein a maximum width of the first portions is about twice a width of the neck.

5. An integrated circuit according to claim 1, wherein the side walls include second portions between the neck and the bottom wall, with the second portions being substantially parallel to one another.

6. An integrated circuit according to claim 1, wherein the side walls include second portions between the neck and the bottom wall, with the second portions tapering outwards from the neck as the distance from the bottom wall decreases.

7. An integrated circuit according to claim 1, wherein the side walls include second portions between the neck and the bottom wall, with the second portions being convex therebetween.

8. An integrated circuit according to claim 1, wherein the bottom wall is substantially flat.

9. An integrated circuit according to claim 1, wherein the bottom wall is rounded.

10. An integrated circuit according to claim 1, wherein said semiconductor substrate further includes at least one shallow isolation trench therein on the at least one deep isolation trench, and being defined by side walls and a bottom wall, the at least one shallow isolation trench being filled with said insulation material and the bottom wall thereof interfaces with a maximum width of the first portions of said at least one deep isolation trench.

11. An electrical device comprising:
    a semiconductor substrate having at least one deep isolation trench therein defined by side walls and a bottom wall, the side walls being configured with a neck and including first portions that taper outwards from the neck as a distance from the bottom wall increases;
    insulation material on the side walls and on the bottom wall of the at least one deep isolation trench for delimiting a cavity therein, and for forming a plug that closes the cavity, with the neck determining a depth of the plug; and
    at least one integrated circuit on said semiconductor substrate comprising at least one component surrounded by said at least one deep isolation trench.

12. An electrical device according to claim 11, wherein at a depth of the neck is within a range of about 0.2 to 1 micrometer from a surface of said semiconductor substrate.

13. An electrical device according to claim 11, wherein a slope of the first portions is within a range of about 50 to 85 degrees.

14. An electrical device according to claim 11, wherein a maximum width of the first portions is about twice a width of the neck.

15. An electrical device according to claim 11, wherein the side walls include second portions between the neck and the bottom wall, with the second portions being substantially parallel to one another.

16. An electrical device according to claim 11, wherein the side walls include second portions between the neck and the bottom wall, with the second portions tapering outwards from the neck as the distance from the bottom wall decreases.

17. An electrical device according to claim 11, wherein the side walls include second portions between the neck and the bottom wall, with the second portions being convex therebetween.

18. An electrical device according to claim 11, wherein the bottom wall is substantially flat.

19. An electrical device according to claim 11, wherein the bottom wall is rounded.

20. An electrical device according to claim 11, wherein said semiconductor substrate further includes at least one shallow isolation trench therein on the at least one deep isolation trench, and being defined by side walls and a bottom wall, the at least one shallow isolation trench being filled with said insulation material and the bottom wall thereof interfaces with a maximum width of the first portions of said at least one deep isolation trench.

* * * * *